United States Patent
Isken et al.

(10) Patent No.: US 6,710,645 B2
(45) Date of Patent: Mar. 23, 2004

(54) AMPLIFIER CIRCUIT WITH OFFSET COMPENSATION, IN PARTICULAR FOR DIGITAL MODULATION DEVICES

(75) Inventors: Martin Isken, Neu-Ulm (DE); Josef Schmal, München (DE); Bernd Memmler, Ottobrunn (DE); Günther Tränkle, Neu-Ulm (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/853,471

(22) Filed: May 11, 2001

(65) Prior Publication Data

US 2001/0048344 A1 Dec. 6, 2001

(30) Foreign Application Priority Data

May 11, 2000 (DE) .......................... 100 23 114

(51) Int. Cl.⁷ ................................................ H03F 1/02
(52) U.S. Cl. .......................................... 330/9; 330/259
(58) Field of Search ....................... 330/69, 9, 252, 330/259; 4/9, 252, 259; 327/307

(56) References Cited

U.S. PATENT DOCUMENTS 4,395,681 A * 7/1983 Hornung et al. ............. 330/259
5,061,900 A * 10/1991 Vinn et al. ..................... 330/9
5,821,795 A * 10/1998 Yasuda et al. ............... 327/307
6,069,866 A * 5/2000 Pietruszynski et al. ...... 330/254

FOREIGN PATENT DOCUMENTS

EP 0693823 A1 1/1996

OTHER PUBLICATIONS

"Semiconductor Circuit Engineering" (Tietze et al.), Springer Verlag Berlin, 1999 edition, pp. 1053–1056.

* cited by examiner

Primary Examiner—Van Khanh Nguyen
(74) Attorney, Agent, or Firm—Laurence A. Greenberg; Werner H. Stemer; Ralph E. Locher

(57) ABSTRACT

An offset voltage at an output of a differential amplifier is compensated for by a control circuit having a digital setting device. The control circuit has a control device which is controlled by an offset voltage of the differential amplifier and which feeds an offset compensation signal into the differential amplifier. Compared with analog compensation with an external storage capacitor, temporal drift effects do not distort the offset compensation on the differential amplifier. The described principle can be applied, for example, in radio frequency receiver circuits.

9 Claims, 2 Drawing Sheets

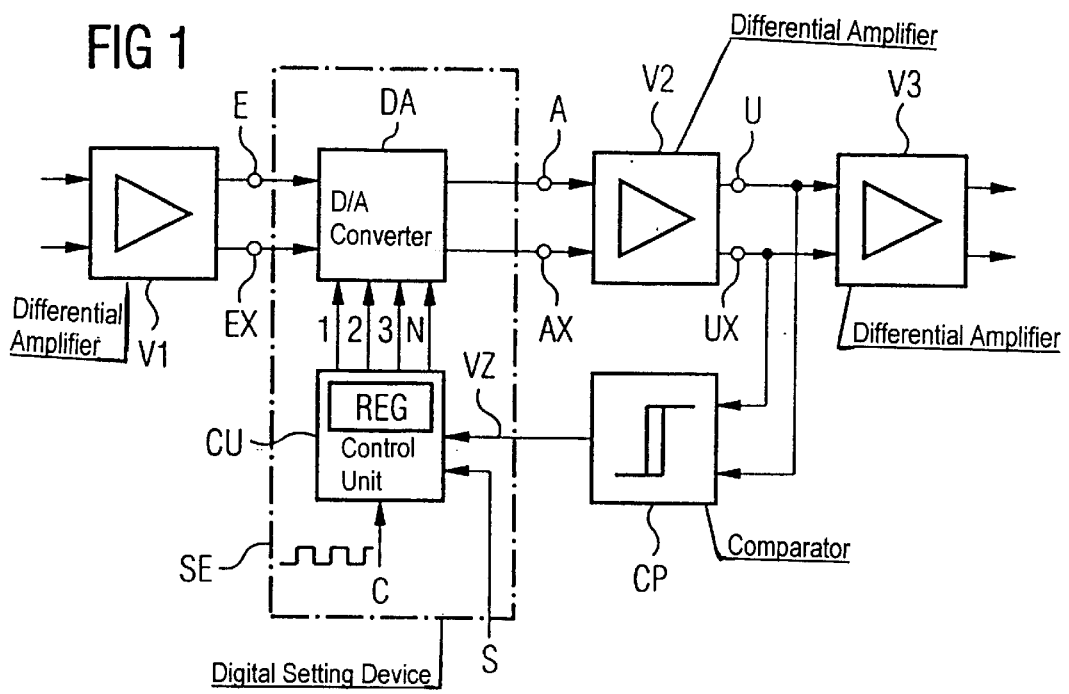
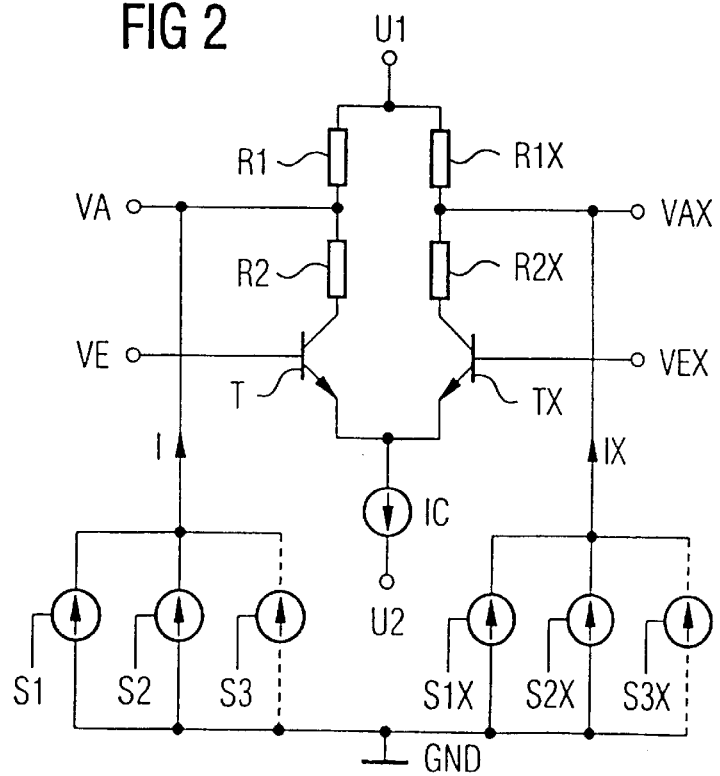

AMPLIFIER CIRCUIT WITH OFFSET COMPENSATION, IN PARTICULAR FOR DIGITAL MODULATION DEVICES

BACKGROUND OF THE INVENTION

Field of the Invention

The invention relates to an amplifier circuit with offset compensation, in particular for digital modulation devices. The amplifier circuit has a differential amplifier and a control circuit with a control switch which is controlled by an offset voltage of the differential amplifier and which feeds an offset compensation signal into the differential amplifier.

Offset voltages normally occur at the output in the case of integrated differential amplifiers. The offset voltages may, for example, be determined by manufacturing tolerances that may have a negative effect on the symmetry of the circuit configuration. Other possible causes for offset voltages at outputs of differential amplifiers are mismatching of the integrated components or, in the case of direct conversion receiver (DCR) architectures of radio-frequency receivers, self-combining effects.

In receiver paths of radio-frequency receivers, such as those used in large numbers in mobile radio applications, analog/digital converters are normally connected downstream of differential amplifiers or combiner stages, which may have DC voltage offsets at the output side, thereby enabling digital further processing of data or voice signals in the baseband. However, if the signal fed to the AD converters has a DC voltage offset, the converters, which have a limited dynamic range, may be overloaded.

It is known for DC voltage offsets to be compensated by providing a capacitive connection to the downstream stage. However, if the frequency of the user information signal is low, the connection capacitors required for integration are too large and too expensive.

A generic amplifier circuit with analog offset compensation of DC voltage offsets is known from Published, European Patent Application EP 0 693 823 A1. The offset voltage is fed therein via an operational amplifier to a capacitor that is provided externally. A comparison of the capacitor voltage with a reference voltage enables generation of compensation currents that counteract the offset voltage.

This known offset compensation presents the disadvantage that leakage currents may flow due to less than ideal conditions in the capacitor or the integrated circuit, whereby the voltage present on the capacitor is subject to temporal drift. This may distort the offset compensation. Consequently, the selected capacitor must not be too small. Furthermore, excessive charge or discharge currents may result in control instabilities.

SUMMARY OF THE INVENTION

It is accordingly an object of the invention to provide an amplifier circuit with offset compensation, in particular for digital modulation devices that overcomes the above-mentioned disadvantages of the prior art devices of this general type, in which a drift-free offset compensation, which enables rapid adjustment, is implemented.

With the foregoing and other objects in view there is provided, in accordance with the invention, an amplifier circuit with offset compensation. The amplifier circuit contains a differential amplifier outputting an offset voltage, and a control circuit having a digital setting device connected to the differential amplifier. The control circuit receives and processes the offset voltage of the differential amplifier and feeds an offset compensation signal back to the differential amplifier.

The object is achieved according to the invention with an amplifier circuit of the aforementioned type, in which the control circuit has a digital setting device.

The implementation of the amplifier circuit with a digital setting device in the control circuit offers the advantage that, due to the elimination of an external storage capacitor and associated time constants, very fast, drift-free compensation of a DC voltage offset is possible. Furthermore, the compensation can be carried out very quickly, since the duration depends only on the response time of the differential amplifier.

Further advantages are offered by the facility for chip-internal integration of the digital setting device, thereby eliminating the need for a connection pin. Furthermore, in one circuit configuration, there is no need to take account of a reduction in leakage currents that could discharge the capacitor. The offset voltage can be fed to the digital setting device. An offset compensation signal, which can be fed into the differential amplifier, can be formed in the digital setting device.

In an advantageous embodiment of the present invention, a comparator is connected on the output side to the differential amplifier in order to provide the offset voltage sign.

In a further advantageous embodiment of the present invention, the setting device is connected to the comparator in order to supply the output voltage sign. This produces a particularly simple circuit configuration, since only the offset voltage sign, which may be binary-coded in one bit, is supplied to the digital setting device.

In a further advantageous embodiment of the present invention, the setting device has a setting or control unit with a downstream digital/analog converter.

In a further advantageous embodiment of the present invention, the setting unit and a digital/analog converter are connected to a word line in order to transmit a setting parameter.

In a further advantageous embodiment of the present invention, the setting unit has a register to store a digitally coded offset compensation value.

In a further advantageous embodiment of the present invention, the digital/analog converter has current sources. Compensation currents which can be fed to the differential amplifier and which counteract the offset voltage can thereby be generated.

In a further advantageous embodiment of the present invention, the comparator has a hysteresis which describes the dependence of the sign on the output side on the offset voltage on the input side, the hysteresis advantageously being smaller than the minimum offset voltage which is to be compensated. A sign, which may be binary-coded, can thereby be assigned in a reliable manner to each offset voltage present on the input side on the comparator. A logical 1, for example, can be allocated to a positive sign, and a logical 0 can be allocated to a negative sign. The logical level allocation can also be reversed.

Finally, in an advantageous embodiment of the present invention, the control circuit can have a control unit to form the offset compensation signal with what is known as the "successive approximation" method. In an analog/digital conversion according to the successive approximation method, starting with the most significant bit (MSB) and continuing through to the least significant bit (LSB), in each case one bit is set and a subsequent check is carried out to establish whether a sign change occurs in a comparison between a required value and an actual value. If so, the bit is withdrawn. If not, the bit remains set. In each case, the next lowest bit is subsequently set and a required value is again compared with an actual value. This successive approximation procedure is repeated until the lowest bit is also defined. Since, in the present configuration, the offset voltage sign can be derived from a differential signal, no required signal or reference signal is needed to form the sign.

Other features which are considered as characteristic for the invention are set forth in the appended claims.

Although the invention is illustrated and described herein as embodied in an amplifier circuit with offset compensation, in particular for digital modulation devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a first embodiment of an amplifier circuit according to the invention;

FIG. 2 is a detailed circuit diagram of a digital/analog converter shown in FIG. 1;

DESCRIPTION OF THE PREFERRED EMBODIMENTS

Figure 3:
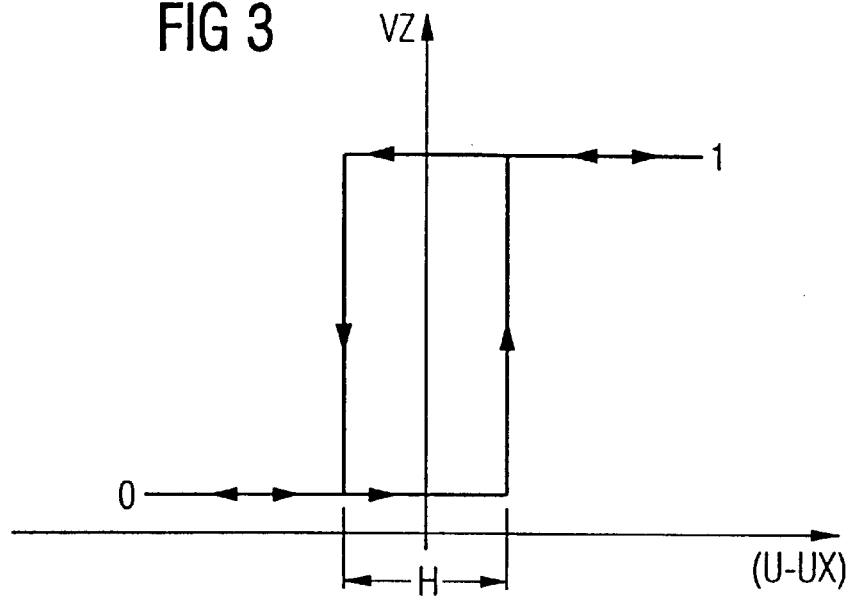
FIG. 3 is a graph showing the hysteresis of the comparator shown in FIG. 1.

In all the figures of the drawing, sub-features and integral parts that correspond to one another bear the same reference symbol in each case. Referring now to the figures of the drawing in detail and first, particularly, to FIG. 1 thereof, there is shown an input amplifier V1 to which a differential amplifier V2 is connected on an output side, and an output amplifier V3 connected downstream of the latter. The amplifiers V1, V2, V3 are differential amplifiers. A comparator CP, which is connected to a digital setting device SE, is furthermore connected downstream of the differential amplifier V2. The digital setting device SE has a control unit CU with a register REG. A digital/analog converter DA with two inputs E, EX and two outputs A, AX, which is connected between the input amplifier V1 and the differential amplifier V2, is connected to the control unit CU.

The differential amplifier V2 may have an offset on the output side. The comparator CP, which is connected to the two differential outputs U, UX of the differential amplifier, compares the voltage U on one output of the differential amplifier with the voltage UX on the other output of the differential amplifier V2. An offset voltage sign VZ is available on an output side of the comparator CP. The digital setting device SE is connected to the comparator CP, which, if the voltage on the first output terminal U of the differential amplifier is greater than the voltage UX on the second output terminal of the differential amplifier, supplies a logical 1, and otherwise a logical 0. The setting device SE has the control unit CU and the digital/analog converter DA, which are interconnected via an N-bit word line 1, 2, 3, N. A clock signal C and a start signal S can be fed along with the sign VZ to the control unit CU. The control unit CU has a register REG to store a digitally coded compensation value. An N-bit offset compensation signal can be fed to the digital/analog converter DA, which, depending on the offset compensation signal, generates compensation currents which counteract the offset voltage of the differential amplifier V2. The digital/analog converter DA may have current sources for this purpose.

The circuit according to FIG. 1 may be operated with the successive approximation method. However, in contrast to the conventionally known successive approximation method, no sample-and-hold component is required to store a reference value in the present amplifier circuit. If the offset-affected signal at the output of the differential amplifier V2 is present as the differential signal U, UX, the sign VZ can be determined directly by forming the differential voltage.

Figure 4:
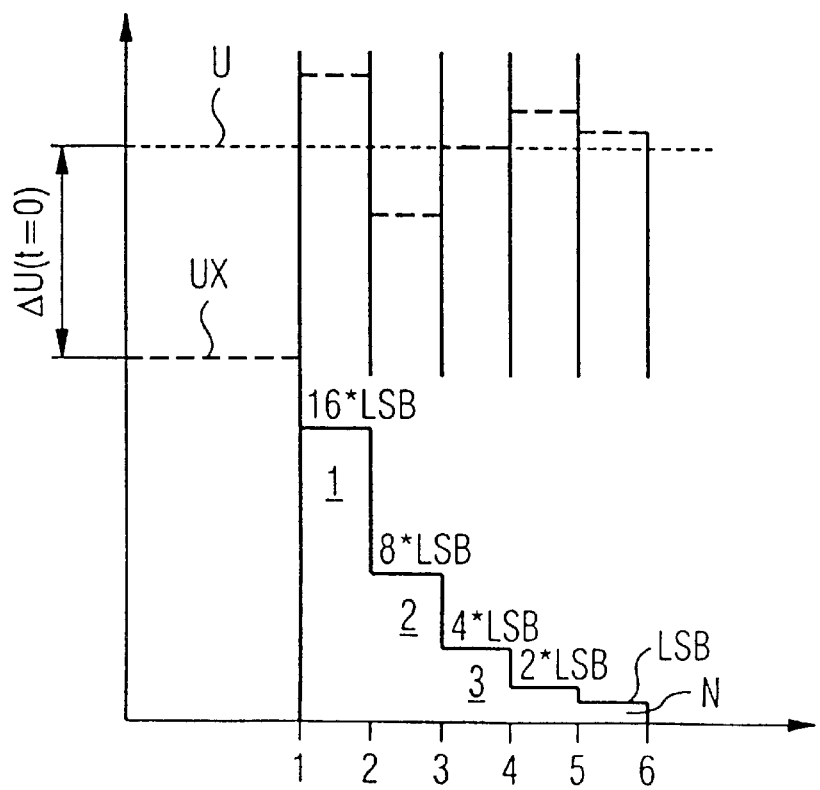
FIG. 4 is a graph of an adjustment process using the amplifier circuit shown in FIG. 1.

The formation of the correct compensation value and its storage in the register REG are explained with reference to the diagram according to FIG. 4. Before the start of the compensation, an offset voltage $\Delta U$, which is obtained from the difference between the differential signal voltages U, UX, is present on the output side on the differential amplifier V2. The most significant bit 1, which corresponds to the 16-fold value of the least significant bit LSB, is first set in the control unit CU. In the digital/analog converter DA, a corresponding compensation signal is supplied as the compensation current to the differential amplifier V2. Depending thereon, an offset voltage, which now has a different sign compared with the sign it had before the start of the compensation, is set at the output of the differential amplifier V2. The comparator CP detects the change of sign. The most recently set bit 1 is consequently withdrawn in the control unit CU, and the next lowest bit 2 is set. This corresponds to the 8-fold value of the least significant bit LSB. With this new compensation value, corresponding compensation currents are in turn supplied to the differential amplifier V2. Since the comparator CP now detects no change of sign, the most recently set bit remains set. In the next step, the next lowest bit is again set. This procedure is repeated until the least significant bit LSB is defined. The N-bit compensation signal formed in this way is stored in the register REG in a digital and drift-free form. The offset voltage on the output side on the differential amplifier V2 is thus either 0 or minimal. Stages connected downstream of the differential amplifier V2 in the user signal path, for example the terminal amplifier V3, can be operated as offset-free. This is advantageous, particularly for analog/digital converters present in the baseband component, in which overload can now be avoided.

FIG. 2 shows a more detailed embodiment of the digital/analog converter DA of the type that can be used, for example, in the block diagram according to FIG. 1. A differential amplifier with two inputs VE, VEX and two outputs VA, VAX is indicated. The inputs VE, VEX are connected to base terminals of two emitter-coupled transistors T, TX. A constant current source IC in the shared emitter line causes a sum of emitter currents to remain constant. The outputs of the differential amplifier VA, VAX are connected to collector terminals of the transistors T. TX via a resistor network R1, R1X, R2, R2X, to which a first supply voltage U1 can be connected. The constant current source IC in the shared emitter line is connected to a second supply voltage terminal U2. The outputs VA, VAX of the differential amplifier are connected to current sources that act on the collector resistors of the differential amplifier. The current sources are switchable current sources S1, S2, S3, S1X, S2X, S3X, which are connected to a ground terminal GND. They serve to generate compensation currents I, IX, which counteract the offset voltage. The compensation currents I, IX may be generated depending on the offset voltage which is to be compensated. The current sources are advantageously binary-coded.

FIG. 3 describes the hysteresis formed in the comparator CP. Depending on the differential voltage values U, UX of the differential amplifier V2 present at the outputs of the comparator CP, either a logical 0 or a logical 1 is supplied at the output of the comparator CP. A hysteresis H is provided for this purpose, so that, in all cases, a reliable decision can be made in the comparator CP. The hysteresis H should advantageously be less than the minimum offset voltage value to be compensated on the differential amplifier V2.

We claim:

1. An amplifier circuit with offset compensation, comprising:
   a differential amplifier having a differential output including two output terminals outputting an offset voltage; and
   a control circuit having a digital setting device connected to said differential amplifier, said control circuit receiving and processing the offset voltage of said differential amplifier and feeding an offset compensation signal back to said differential amplifier, said control circuit having a comparator with an output outputting a sign of the offset voltage, and said comparator having an input including two input terminals each connected to a respective one of said output terminals of said differential amplifier.

2. The amplifier circuit according to claim 1, wherein said digital setting device is connected to said comparator and receives the sign of the offset voltage.

3. The amplifier circuit according to claim 2, wherein said digital setting device has a control unit and a digital/analog converter connected downstream of said control unit.

4. The amplifier circuit according to claim 3, wherein said digital setting device has a word line connected between said control unit and said digital/analog converter for transmitting a setting parameter.

5. The amplifier circuit according to claim 4, wherein said control unit has a register connected for storing a digitally coded offset compensation value.

6. The amplifier circuit according to claim 5, wherein said digital/analog converter has current sources.

7. The amplifier circuit according to claim 1, wherein said comparator has a hysteresis describing a dependency of the sign available at said output of said comparator on the offset voltage available at said input of said comparator.

8. The amplifier circuit according to claim 1, wherein said digital setting device has a control unit to form the offset compensation signal with successive approximation.

9. A digital modulation device, comprising:
   an amplifier circuit with offset compensation, said amplifier containing:
      a differential amplifier having a differential output including two output terminals outputting an offset voltage; and
      a control circuit having a digital setting device connected to said differential amplifier, said control circuit receiving and processing the offset voltage of said differential amplifier, said control circuit feeding an offset compensation signal back to said differential amplifier, said control circuit having a comparator with an output outputting a sign of the offset voltage, and said comparator having an input including two input terminals each connected to a respective one of said output terminals of said differential amplifier.

* * * * *